United States Patent
Lee

(10) Patent No.: US 12,382,766 B2
(45) Date of Patent: Aug. 5, 2025

(54) SEMICONDUCTOR DEVICE PACKAGE

(71) Applicant: SUZHOU LEKIN SEMICONDUCTOR CO., LTD., Taicang (CN)

(72) Inventor: Koh Eun Lee, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 903 days.

(21) Appl. No.: 16/972,517

(22) PCT Filed: Jun. 5, 2019

(86) PCT No.: PCT/KR2019/006773
§ 371 (c)(1),
(2) Date: Dec. 4, 2020

(87) PCT Pub. No.: WO2019/235835
PCT Pub. Date: Dec. 12, 2019

(65) Prior Publication Data
US 2021/0273148 A1 Sep. 2, 2021

(30) Foreign Application Priority Data
Jun. 5, 2018 (KR) .......... 10-2018-0064804

(51) Int. Cl.
*H10H 20/858* (2025.01)
*H10F 77/00* (2025.01)
(Continued)

(52) U.S. Cl.
CPC ....... *H10H 20/8581* (2025.01); *H10F 77/123* (2025.01); *H10F 77/1246* (2025.01);
(Continued)

(58) Field of Classification Search
CPC ....... H01L 33/60; H01L 33/62; H01L 33/486; H01L 33/405; H01L 33/483;
(Continued)

(56) References Cited

U.S. PATENT DOCUMENTS

| 2009/0008433 A1* | 1/2009 | Sakaguchi ........... H05K 3/3478 228/41 |
| 2011/0220926 A1* | 9/2011 | Kim ........................ H01L 33/60 257/E33.065 |

(Continued)

FOREIGN PATENT DOCUMENTS

| JP | 2006-49812 A | 2/2006 |
| JP | 2015-181202 A | 10/2015 |

(Continued)

*Primary Examiner* — Samuel A Gebremariam
*Assistant Examiner* — Jonas T Beardsley
(74) *Attorney, Agent, or Firm* — Birch, Stewart, Kolasch & Birch, LLP

(57) ABSTRACT

An embodiment provides a semiconductor device package, the semiconductor device package comprising: a substrate including an electrode disposed on one surface; a metal sidewall disposed on the substrate while surrounding the electrode; a semiconductor device disposed on the electrode; and a light transmitting member disposed on the metal sidewall to cover the semiconductor device, wherein the metal sidewall has the inner surface and the outer surface which are corrugated, and includes: a first metal part disposed on the substrate; a second metal part disposed on the first metal part; and a third metal part disposed on the second metal part, and the inner surface or the outer surface of the metal sidewall includes a recess portion between the second metal part and the third metal part.

20 Claims, 9 Drawing Sheets

(51) Int. Cl.
  *H10F 77/123* (2025.01)
  *H10F 77/124* (2025.01)
  *H10F 77/20* (2025.01)
  *H10F 77/30* (2025.01)
  *H10F 77/60* (2025.01)
  *H10H 20/823* (2025.01)
  *H10H 20/825* (2025.01)
  *H10H 20/831* (2025.01)
  *H10H 20/84* (2025.01)
  *H10H 20/857* (2025.01)

(52) U.S. Cl.
  CPC ......... *H10F 77/206* (2025.01); *H10F 77/306* (2025.01); *H10F 77/60* (2025.01); *H10F 77/933* (2025.01); *H10H 20/823* (2025.01); *H10H 20/825* (2025.01); *H10H 20/8312* (2025.01); *H10H 20/84* (2025.01); *H10H 20/857* (2025.01); *H10H 20/8583* (2025.01)

(58) Field of Classification Search
  CPC . H01L 33/642; H01L 33/641; H01L 27/1463; H01L 27/14643
  See application file for complete search history.

(56) References Cited

U.S. PATENT DOCUMENTS

| | | | |
|---|---|---|---|
| 2012/0018772 A1 | 1/2012 | Nishijima et al. | |
| 2012/0025215 A1* | 2/2012 | Chen | H01L 33/642 257/690 |
| 2012/0286319 A1 | 11/2012 | Lee et al. | |
| 2013/0193545 A1 | 8/2013 | Jeong et al. | |
| 2014/0284640 A1* | 9/2014 | Lin | H01L 33/62 257/98 |
| 2016/0005931 A1* | 1/2016 | Lee | H01L 33/486 257/98 |
| 2016/0190418 A1* | 6/2016 | Inomata | H01L 33/60 257/98 |
| 2019/0086039 A1* | 3/2019 | Lee | H01L 33/62 |
| 2021/0210655 A1* | 7/2021 | Oh | H01L 33/62 |

FOREIGN PATENT DOCUMENTS

| | | |
|---|---|---|
| JP | 2017-143304 A | 8/2017 |
| KR | 10-1004929 B1 | 12/2010 |
| KR | 10-2011-0109221 A | 10/2011 |
| KR | 10-2012-0127184 A | 11/2012 |
| KR | 10-2013-0087249 A | 8/2013 |
| KR | 10-2018-0020829 A | 2/2018 |

* cited by examiner

SEMICONDUCTOR DEVICE PACKAGE

CROSS REFERENCE TO RELATED APPLICATIONS

This application is the National Phase of PCT International Application No. PCT/KR2019/006773, filed on Jun. 5, 2019, which claims priority under 35 U.S.C. 119 (a) to Patent Application No. 10-2018-0064804, filed in the Republic of Korea on Jun. 5, 2018, all of which are hereby expressly incorporated by reference into the present application.

TECHNICAL FIELD

The embodiment relates to a semiconductor device package.

BACKGROUND ART

A semiconductor device including a compound such as GaN or AlGaN has many advantages, such as having wide and easily adjustable band gap energy, and thus may be used in various ways as a light emitting device, a light receiving device, and various diodes.

In particular, the light emitting devices such as light emitting diodes and laser diodes using compound semiconductor materials of Group III-V or Group II-VI of semiconductor may implement various colors such as red, green, blue, and ultraviolet rays through the development of thin film growth technology and device materials and it is possible to implement white light with good efficiency by using fluorescent materials or by combining colors. In addition, the light emitting devices have advantages of low power consumption, semi-permanent life, fast response speed, safety and environmental friendliness compared to conventional light sources such as fluorescent lamps and incandescent lamps.

In addition, due to the development of device materials, when a light-receiving device such as a photodetector or a solar cell is manufactured using a compound semiconductor material of Group III-V or Group II-VI of a semiconductor, it is possible to use light in various wavelength ranges from gamma rays to radio wavelength ranges by absorbing light in various wavelength ranges and generating photocurrent. In addition, due to the advantages of fast response speed, safety, environmental friendliness, and easy adjustment of device materials, it may be easily used for power control or ultra-high frequency circuits or communication modules.

Therefore, the application field of semiconductor devices is expanding to a transmission module of an optical communication means, a light-emitting diode backlight that may replace a cold cathode fluorescence lamp (CCFL) constituting the backlight of LCD (Liquid Crystal Display) display devices, a white light emitting diode lighting devices that may replace fluorescent or incandescent bulbs, automobile headlights, traffic lights, and sensors that detect gas or fire. In addition, the application field of the semiconductor device may be extended to a high frequency application circuit, other power control devices, and communication modules.

In particular, the semiconductor device that emits light in the ultraviolet wavelength band may be used for curing, medical, and sterilizing purposes by curing or sterilization.

Meanwhile, heat dissipation may be an important consideration when designing a semiconductor device. In addition, when the body of the semiconductor device is made of metal in order to improve the heat dissipation of the semiconductor device, it is necessary to also design for short circuit prevention.

DISCLOSURE

Technical Problem

The embodiment provides a semiconductor device package in which a metal sidewall is disposed on a substrate.

The embodiment provides a semiconductor device package having excellent heat dissipation.

The problem to be solved in the embodiment is not limited thereto, and the purpose or effect that may be grasped from the solution or embodiment of the problem described below will be also included.

Technical Solution

According to an aspect of the present invention, a semiconductor device package may include a substrate including an electrode disposed on one surface thereof: a metal sidewall disposed on the substrate to surround the electrode: a semiconductor device disposed on the electrode; and a light transmitting member disposed on the metal sidewall to cover the semiconductor device, wherein the metal sidewall has an inner surface and an outer surface which are corrugated, and the metal sidewall may include: a first metal part disposed on the substrate; a second metal part disposed on the first metal part; and a third metal part disposed on the second metal part, the outer surface of the first metal part may be adjacent to the side surface of the substrate than the outer surface of the second metal part, and wherein the inner surface or the outer surface of the metal sidewall may include a recess portion between the second metal part and the third metal part. Each of the first metal part, the second metal part, and the third metal part may include a first maximum width, a second maximum width, and a third maximum width from an inner surface to an outer surface of the metal sidewall, and the first maximum width may be greater than the second maximum width and the third maximum width.

The first metal part may include a first border portion protruding outward than a convex portion of an outer surface of the second metal part, and the thickness of the first metal part may be smaller than that of the second metal part.

The metal sidewall may include a fourth metal part disposed on the third metal part, the fourth metal part may include a fourth maximum width from the inner surface to the outer surface of the metal sidewall, and the fourth maximum width may be smaller than the second maximum width and the third maximum width.

The metal sidewall may be disposed inside the fourth metal part and may include a stepped portion on which the light transmitting member is disposed, and the ratio of the thickness of the light transmitting member and the height from the bottom surface of the stepped portion to the top surface of the metal sidewall may be 0.75:1 to 2.00:1.

The electrode may include a first electrode disposed on the substrate and on which the semiconductor device is disposed; and a second electrode disposed on the substrate and connected to the semiconductor device through a first wire, and wherein the semiconductor device package may further include a first pad and a second pad disposed under the substrate: a first through electrode passing through the substrate and connecting the first electrode and the first pad;

and a second through electrode passing through the substrate and connecting the second electrode and the second pad.

The first pad may include a first-first conductive layer disposed under the substrate; and a second-first conductive layer disposed under the first-first conductive layer, and the second pad may include a first-second conductive layer disposed under the substrate; and a second-second conductive layer disposed under the first-second conductive layer, and wherein the first-second conductive layer may include a first protrusion protruding toward the first pad than the second-second conductive layer and connected to the second through electrode.

An insulating portion disposed between the first pad and the second pad may be included.

The insulating portion may surround the first protrusion.

The first pad may include a recess recessed in a direction opposite to the second pad at a position facing the first protrusion.

The insulating portion may include a second protrusion disposed in the recess.

The first-first conductive layer may include a second border portion that protrudes outward than the second-first conductive layer, and the first-second conductive layer may include a third border portion that protrudes outward than the second-second conductive layer.

The semiconductor device package may include a Zener diode disposed on the second electrode and connected to the first electrode through a second wire, wherein the first electrode may include a first mounting portion on which the semiconductor device is disposed; and a first connection portion connecting the first mounting portion and the first through electrode and connecting the Zener diode through a second wire, wherein the second electrode may include a second mounting unit on which the Zener diode is disposed; and a second connection portion connecting the second mounting portion and the second through electrode and connecting the semiconductor device through a first wire, and wherein the first connection portion and the second connection portion may be disposed to be spaced apart from each other in a first direction, and the first mounting portion and the second mounting portion may be disposed to be spaced apart from each other in a second direction perpendicular to the first direction between the first connecting portion and the second connecting portion.

The semiconductor device may emit ultraviolet light.

The metal sidewall may include copper (Cu), and the semiconductor device package may further include a first protective layer surrounding the metal sidewall and including gold (Au).

The first electrode, the second electrode, the first pad, and the second pad may have the same composition as the metal sidewall, and the semiconductor device package may further include a second protective layer surrounding the first electrode, the second electrode, the first pad, and the second pad, respectively, and including gold (Au); a third conductive layer disposed between the first electrode, the second electrode, the first pad, and the second pad and the second protective layer and including nickel (Ni); and a fourth conductive layer disposed between the third conductive layer and the second protective layer and including palladium (Pd).

Advantageous Effects

In the semiconductor device package according to the embodiment, by disposing a metal sidewall on the substrate, the metal sidewall may be formed on the substrate by plating, and thus, adhesion between the substrate and the metal sidewall may be improved.

In addition, it is possible to improve the heat dissipation efficiency of semiconductor device packages.

Various and beneficial advantages and effects of the present invention are not limited to the above description, and will be more easily understood in the course of describing specific embodiments of the present invention.

BEST MODE

Hereinafter, the preferred embodiments of the present invention will be described in detail with reference to the accompanying drawings.

However, the technical idea of the present invention is not limited to some embodiments to be described, but may be implemented in a variety of different forms, and one or more of the components among the embodiments may be selectively combined and substituted within the scope of the technical idea of the present invention.

In addition, the terms (including technical and scientific terms) used in the embodiments of the present invention may be interpreted as a meaning that may be generally understood by those of ordinary skill in the art, unless explicitly defined and described, and the commonly used terms such as terms defined in a dictionary may be interpreted in consideration of the meaning in the context of the related technology.

In addition, the terms used in the embodiments of the present invention are for describing the embodiments and are not intended to limit the present invention.

In this specification, the singular form may also include the plural form unless specifically stated in the phrase, and when described as "at least one (or more than one) of A, B and C", it may include one or more of all combinations that may be combined with A, B, and C.

In addition, in describing the components of an embodiment of the present invention, the terms such as first, second, A, B, (a), and (b) may be used.

These terms are only for distinguishing the component from other components, and are not limited to the nature, order, or sequence of the component by the term.

And, when a component is described as being 'coupled' or 'connected' to another component, the component is not only directly coupled or connected to the other component, but also the component may also include the case of being 'coupled' or 'connected' due to another component between the other components.

In addition, when it is described as being formed or disposed on the "top (upper) or bottom (lower)" of each component, the top (upper) or bottom (lower) is not only when the two components are in direct contact with each other, but also it may include a case in which one or more other components may be formed or disposed between the two components. In addition, when expressed as "top (upper) or bottom (lower)", the meaning of not only an upward direction but also a downward direction based on one component may be included.

Figure 1:
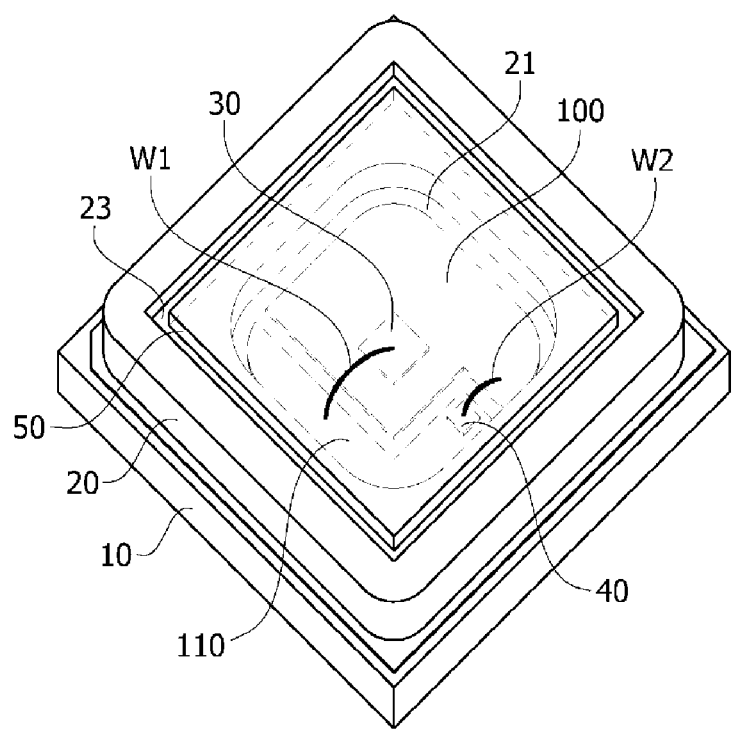
FIG. 1 is a conceptual diagram of a semiconductor device package according to an embodiment of the present invention.
Figure 2:
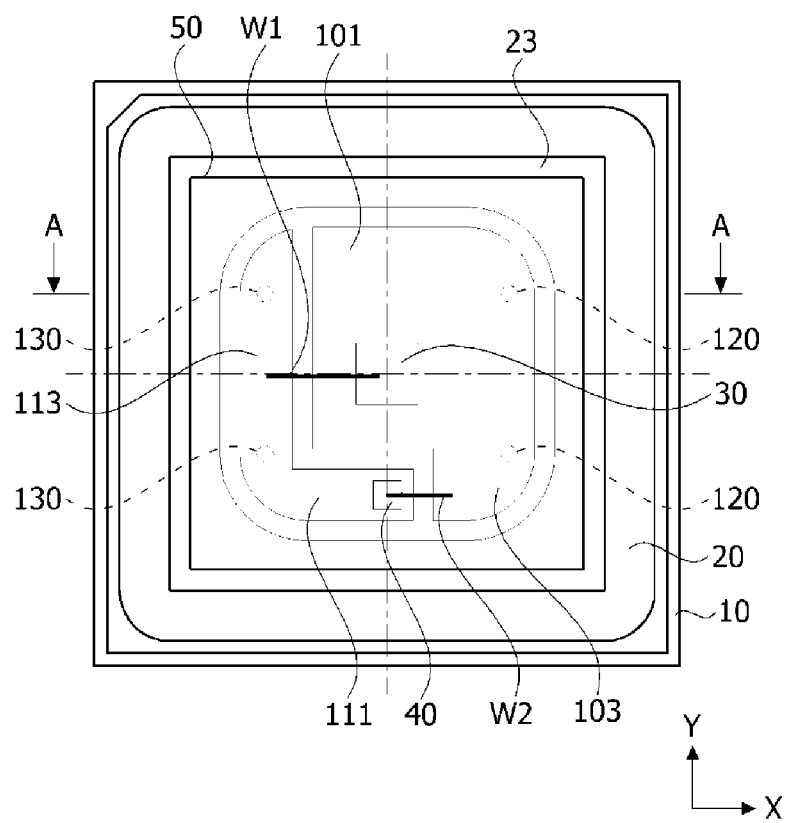
FIG. 2 is a plan view of FIG. 1.
Figure 3:
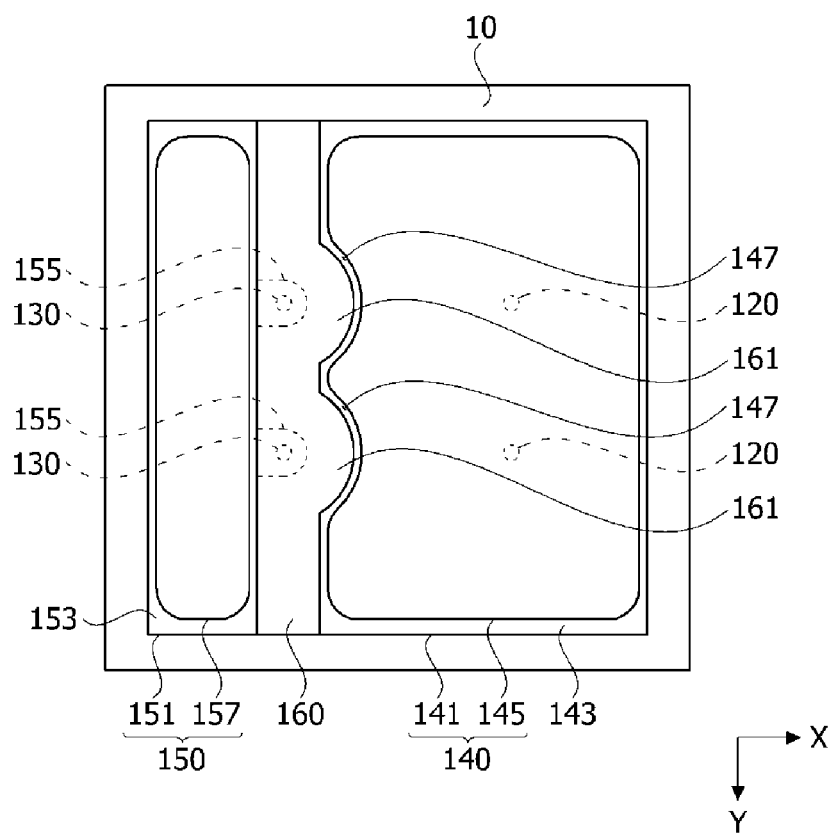
FIG. 3 is a bottom view of FIG. 1.
Figure 4:
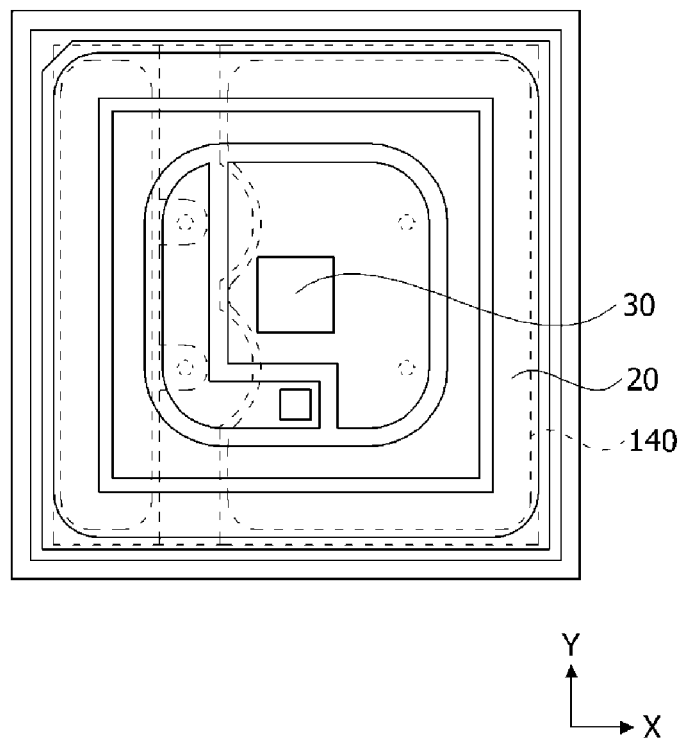
FIG. 4 is a view showing FIG. 3 superimposed on FIG. 2.
Figure 5:
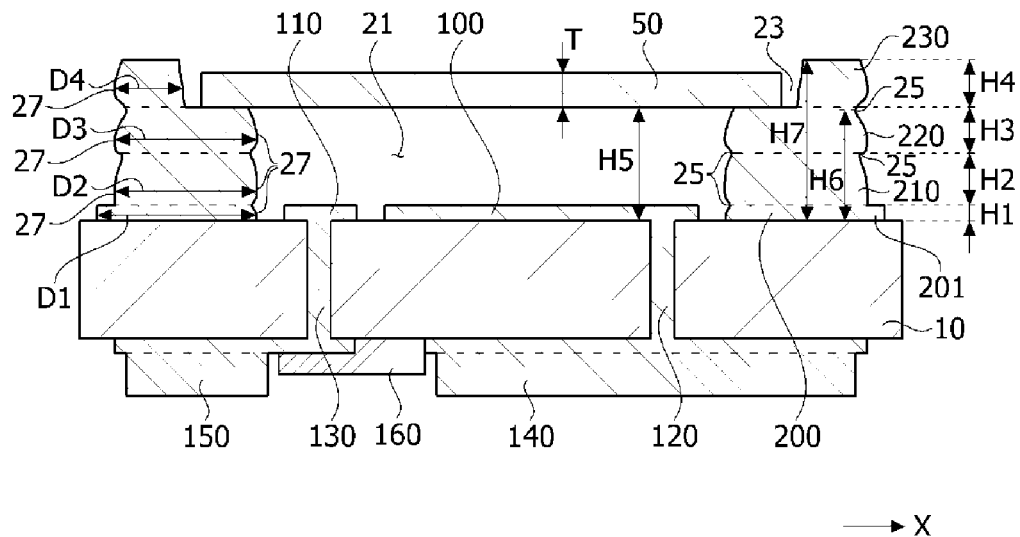
FIG. 5 is a cross-sectional view taken in the A-A direction in FIG. 2.

FIG. 1 is a conceptual diagram of a semiconductor device package according to an embodiment of the present invention, FIG. 2 is a plan view of FIG. 1, FIG. 3 is a bottom view of FIG. 1, FIG. 4 is a view showing FIG. 3 superimposed on FIG. 2, and FIG. 5 is a cross-sectional view taken in the A-A direction in FIG. 2:

Referring to FIG. 1, a semiconductor device package according to an embodiment of the present invention may include a substrate 10, a metal sidewall 20, a semiconductor device 30, a Zener diode 40, and a light transmitting member 50.

The substrate 10 may include an insulating substrate, a printed circuit board (PCB), or a metal substrate. The substrate 10 may be an insulating substrate including a ceramic material. The ceramic material may include low temperature co-fired ceramic (LTCC) or high temperature co-fired ceramic (HTCC). As an example, the substrate 10 may include a ceramic material such as AlN. However, it is not necessarily limited thereto, and the substrate 10 may include other ceramic materials such as $SiO_2$, $Si_xO_y$, $Si_3N_4$, $Si_xN_y$, $SiO_xN_y$, $Al_2O_3$, and the like.

The width of the substrate 10 may be 2.0 mm to 5.0 mm, for example, 3.50 mm.

A first electrode 100 and a second electrode 110 may be disposed on the substrate 10.

The metal sidewall 20 may be disposed on the substrate 10. Illustratively, the metal sidewall 20 may be directly contacted with the top surface of the substrate 10, but is not limited thereto, and a seed layer (not shown) formed by sputtering or the like may be disposed between the substrate 10 and the metal sidewall 20.

The metal sidewall 20 may be disposed to surround the first electrode 100 and the second electrode 110.

The metal sidewall 20 may constitute a cavity 21.

The cavity 21 may have the bottom surface including at least a part of the top surface of the substrate 10.

The cavity 21 may include an air gap. The air gap may mean a space filled with air, and one air gap may be formed over the entire area of the cavity 21.

However, the present invention is not limited thereto, and various gases other than air (e.g., nitrogen) may be filled in the cavity 21, and a polymer resin may be filled.

The side surface of the cavity 21 may be disposed vertically with respect to the bottom surface of the cavity 21. However, the present invention is not limited thereto, and the side surface of the cavity 21 may be disposed to be inclined at an angle greater than 90 degrees with respect to the bottom surface of the cavity 21.

The metal sidewall 20 may include a stepped portion 23. The stepped portion 23 may be disposed above the cavity 21. The stepped portion 23 may be extended from the inner surface of the metal sidewall 20 toward the outer surface of the metal sidewall 20, and may be extended from the top surface of the metal sidewall 20 toward the substrate 10.

The semiconductor device 30 may be disposed on the first electrode 100. The semiconductor device 30 may be connected to the second electrode 110 through the first wire W1.

The semiconductor device 30 may emit ultraviolet light. As an example, the semiconductor device 30 may emit light in a near ultraviolet wavelength band (UV-A) having a peak wavelength in the range of 320 nm to 420 nm. As another example, the semiconductor device 30 may emit light in a far ultraviolet wavelength band (UV-B) having a peak wavelength in the range of 280 nm to 320 nm. As another example, the semiconductor device 30 may emit light in a deep ultraviolet wavelength band (UV-C) having a peak wavelength in the range of 100 nm to 280 nm.

The Zener diode 40 may be disposed on the second electrode 110. The Zener diode 40 may be connected to the first electrode 100 through a second wire W2.

The light transmitting member 50 may be disposed on the metal sidewall 20. The light transmitting member 50 may be disposed on the bottom surface of the stepped portion 23. As a result, the bottom surface of the light transmitting member 50 may be disposed lower than the top surface of the metal sidewall 20. With this configuration, it is possible to improve the problem that the light transmitting member 50 is damaged by a dicing blade during package cutting.

The light transmitting member 50 may be made of quartz. However, it is not necessarily limited thereto, and the light transmitting member 50 may include other materials having excellent transmittance of ultraviolet light.

Referring to FIG. 2, the first electrode 100 and the second electrode 110 may be disposed to be spaced apart from each other.

The first electrode 100 and the second electrode 110 may be disposed to be spaced apart from the metal sidewall 20.

The first electrode 100 may include a first mounting portion 101 and a first connection portion 103. A semiconductor device 30 may be disposed on the first mounting portion 101.

The first connection portion 103 may connect the first mounting portion 101 and the first through electrode 120. The pair of first through electrodes 120 may be disposed symmetrically with respect to a center line in the first direction (X-axis direction) of the package.

The first connection portion 103 and the Zener diode 40 may be connected through a second wire W2.

The second electrode 110 may include a second mounting portion 111 and a second connection portion 113. The Zener diode 40 may be disposed on the second mounting portion 111. The second connection portion 113 may connect the second mounting portion 111 and the second through electrode 130. The pair of second through electrodes 130 may be symmetrically disposed with respect to a center line in the X-axis direction of the package.

The second connector 113 and the semiconductor device 30 may be connected through a first wire W1.

The first connection portion 103 and the second connection portion 113 may be disposed to be spaced apart from each other in the X-axis direction.

The first mounting portion 101 and the second mounting portion 111 may be disposed to be spaced apart from each other in a second direction (Y-axis direction) perpendicular to the X-axis direction between the first connection portion 103 and the second connection portion 113. The X-axis and Y-axis directions may be parallel to the top surface of the substrate 10.

Since the first connection portion 103 protrudes in the Y-axis direction from the first mounting portion 101, a region in which the second wire W2 may be connected without interfering with the semiconductor device 30 may be secured.

Since the second connection portion 113 protrudes in the Y-axis direction from the second mounting portion 111, a region in which the first wire W1 may be connected without interfering with the Zener diode 40 may be secured.

The semiconductor device 30 and the Zener diode 40 may be disposed to be spaced apart from each other in the Y axis direction of the package.

The semiconductor device 30 may be disposed in a region where the center line in the X-axis direction and the center line in the Y-axis direction of the package intersect.

The Zener diode 40 may be disposed on a center line in the Y-axis direction of the package.

Referring to FIG. 3, a first pad 140, a second pad 150 and an insulating portion 160 may be disposed under the substrate 10.

The first pad 140 and the second pad 150 may be disposed to be spaced apart from each other in the X-axis direction.

A spacing distance between the first pad 140 and the second pad 150 in the X-axis direction may be 0.40 mm to 0.60 mm, and may be, for example, 0.50 mm.

The first pad 140 may include a first-first conductive layer 141 and a second-first conductive layer 145.

The first-first conductive layer 141 may be disposed on the under the substrate 10, and the second-first conductive layer 145 may be disposed under the first-first conductive layer 141. The first-first conductive layer 141 may include a second border portion 143. The second border portion 143 may protrude outward than the side surface of the second-first conductive layer 145.

The width of the first-first conductive layer 141 in the X-axis direction may be 0.60 mm to 0.80 mm, and for example, may be 0.70 mm. The width of the first-first conductive layer 141 in the Y-axis direction may be 3.00 mm to 3.60 mm, and for example, may be 3.30 mm. The width of the second-first conductive layer 145 in the X-axis direction may be 0.50 mm to 0.70 mm, and for example, may be 0.60 mm. The width of the second-second conductive layer 145 in the Y-axis direction may be 2.80 mm to 3.40 mm, and for example, may be 3.10 mm.

The first-first conductive layer 141 may be connected to the first through electrode 120 in a region overlapped with the second-first conductive layer 145 in the vertical direction.

The second pad 150 may include a first-second conductive layer 151 and a second-second conductive layer 157.

The first-second conductive layer 151 may be disposed under the substrate 10, and the second-second conductive layer 157 may be disposed under the first-second conductive layer 151. The first-second conductive layer 151 may include a third border portion 153. The third border portion 153 may protrude outward than the side surface of the second-second conductive layer 157.

The width of the first-second conductive layer 151 in the X-axis direction may be 1.90 mm to 2.30 mm, and for example, may be 2.10 mm. The width of the first-second conductive layer 151 in the Y-axis direction may be 3.00 mm to 3.60 mm, and for example, it may be 3.30 mm. The width of the second-second conductive layer 157 in the X-axis direction may be 1.80 mm to 2.20 mm, and for example, may be 2.00 mm. The width of the second-second conductive layer 157 in the Y-axis direction may be 2.80 mm to 3.40 mm, and for example, may be 3.10 mm.

The first-second conductive layer 151 may include a first protrusion 155. The first protrusion 155 may protrude toward the first pad 140 from the second-second conductive layer 157 and the third edge 153.

The first protrusion 155 may be extended in the X-axis direction. The first protrusion 155 may be connected to the second through electrode 130.

Due to the first protrusion 155, the second pad 150 may sufficiently secure a gap with the first pad 140 for preventing a short in a region other than the first protrusion 155.

The first pad 140 may include a recess 147. The recess 147 may be formed by being recessed in a direction opposite to the second pad 150 at a position in which the side surface of the first pad 140 faces the first protrusion 155.

The recess 147 may be extended in the X-axis direction. Due to the recess 147, the second pad 150 may sufficiently secure a gap with the first pad 140 for preventing a short in the entire area including the first protrusion 155.

The recess 147 may have a curvature. However, the present invention is not limited thereto, and the recess 147 may have a shape corresponding to the shape of the second protrusion 161. For example, when the second protrusion 161 has a polygonal shape, the recess 147 may also have a polygonal shape.

The insulating portion 160 may be disposed between the first pad 140 and the second pad 150.

The insulating portion 160 may be disposed under the substrate 10, and a portion of the insulating portion 160 may be overlapped with the first protrusion 155 in the vertical direction.

The width of the insulating portion 160 in the X-axis direction may be 0.40 mm to 0.60 mm, and for example, may be 0.50 mm. The width of the insulating portion 160 in the Y-axis direction may be 3.00 mm to 3.60 mm, and for example, it may be 3.30 mm.

The insulating portion 160 may include a second protrusion 161. The second protrusion 161 may be formed such that the side surface of the insulating portion 160 protrudes toward the first pad 140. The second protrusion 161 is illustrated to have a curvature, but is not limited thereto, and the second protrusion 161 may have a polygonal shape.

The second protrusion 161 may be disposed in the recess 147.

The insulating portion 160 may be made of an insulating material. As an example, the insulating portion 160 may include a photoimageable solder resist (PSR).

However, the present invention is not necessarily limited thereto, and the insulating portion 160 may include a modified epoxy resin composition such as EMC, white silicone, a silicone resin composition, a silicone modified epoxy resin, a modified silicone resin composition such as an epoxy modified silicone resin, a polyimide resin composition, a modified polyimide resin composition, polyphthalamide (PPA), polycarbonate resin, polyphenylene sulfide (PPS), liquid crystal polymer (LCP), ABS resin, phenol resin, acrylic resin, PBT resin, etc.

Referring to FIG. 4, the semiconductor device 30 may be disposed on the first pad 140. That is, the semiconductor device 30 may be disposed in a region overlapped with the first pad 140 in the vertical direction.

In this case, one end of the first pad 140 may be extended to a region overlapped with the semiconductor device 30 in the vertical direction, so that the heat dissipation area may increase, and thus the heat dissipation effect may be improved.

The other end of the first pad 140 may be extended to a region overlapped with the metal sidewall 20 in the vertical direction, thereby further increasing the heat dissipation area, and thus, the heat dissipation effect may be further improved.

Referring to FIG. 5, the first through electrode 120 and the second through electrode 130 may penetrate the substrate 10 in the vertical direction.

The first through electrode 120 may connect the first electrode 100 and the first pad 140, and the second through electrode 130 may connect the second electrode 110 and the second pad 150.

The inner and outer surfaces of the metal sidewall 20 may be corrugated. That is, each of the inner surface and the outer surface of the metal sidewall 20 may include a plurality of recess portions 25 and a plurality of convex portions 27. The metal sidewall 20 has an increased surface area due to the plurality of recess portions 25 and the convex portions 27, thereby improving heat dissipation characteristics.

Each of the recess portion 25 and the convex portion 27 may be extended along the metal sidewall 20 to surround the cavity 21.

The height H5 from the top surface of the substrate 10 to the bottom surface of the light transmitting member 50 may be greater than the height H6 up to the recess portion 25 disposed at the uppermost of the recess portions 25 included in the outer surface of the metal sidewall 20 from the top surface of the substrate 10, and may be smaller than the height H7 from the top surface of the substrate 10 to the top surface of the metal sidewall 20. That is, the bottom surface of the light transmitting member 50 may be disposed between the top surface of the metal sidewall 20 and the recess portion 25 disposed at the uppermost of the recess portions 25 included in the outer surface of the metal sidewall 20.

The metal sidewall 20 may include a first metal part 200, a second metal part 210, a third metal part 220, and a fourth metal part 230.

However, the present invention is not limited thereto, and the metal sidewall 20 may include a plurality of metal parts stacked on the substrate 10, for example, three or five or more metal parts.

The first metal part 200 may be disposed on the substrate 10. The second metal part 210 may be disposed on the first metal part 200. The third metal part 220 may be disposed on the second metal part 210. The fourth metal part 230 may be disposed on the third metal part 220. The first to fourth metal parts 200, 210, 220, and 230 may be stacked to be directly contacted with each other.

The first metal part 200 may include a first maximum width D1 from the inner surface to the outer surface of the first metal part 200. The second metal part 210 may include a second maximum width D2 from the inner surface to the outer surface of the second metal part 210. The third metal part 220 may include a third maximum width D3 from the inner surface to the outer surface of the third metal part 220. The fourth metal part 230 may include a fourth maximum width D4 from the inner surface to the outer surface of the fourth metal part 230. The width of the metal part may be parallel to the top surface of the substrate 10 and may mean the width in the first direction (X-axis direction) from the inner surface of the metal sidewall 20 toward the outer surface. In addition, the width of the metal part may vary depending on the height from the top surface of the substrate 10 due to corrugation. In this case, the maximum width of the metal part may mean the maximum value among the widths that the metal part may have.

The first maximum width D1 may be larger than the second maximum width D2 and the third maximum width D3. For example, the outer surface of the first metal part 200 may be closer to the side surface of the substrate 10 than the outer surface of the second metal part 210. That is, the first metal part 200 may include a first border portion 201 protruding outward than the convex portion 27 of the outer surface of the second metal part 210. In addition, the thickness H1 of the first metal part 200 may be smaller than the thickness H2 of the second metal part 210. The thickness may mean the vertical height from the bottom surface to the top surface.

In this case, when the metal sidewall 20 is formed by plating, stress of the substrate 10 or the like may be improved due to the first metal part 200. In addition, since the adhesion area is increased, adhesion between the substrate 10 and the metal sidewall 20 may be improved. In addition, since the first metal part 200 protrudes outward than the second metal part 210, the part in which the first metal part 200 protrudes inward than the second metal part 210 may be eliminated or minimized. Therefore, the area of the bottom surface of the cavity 21 may be increased. In addition, the size and light output of the semiconductor device 30 may be improved.

The border surface between the first metal part 200 and the second metal part 210 may be defined as a plane extended to be parallel to the top surface of the substrate 20 from the top surface of the first border part 201.

The border surface between the second metal part 210 and the third metal part 220 may be defined as a plane whose width in the direction from the inner surface of the metal sidewall 20 to the outer surface of the metal sidewall 20 is the smallest in the recess portion 25 included in the inner surface of the metal sidewall 20. The border surface between the second metal part 210 and the third metal part 220 may be extended to be parallel with the top surface of the substrate 20. The inner surface or outer surface of the metal sidewall 20 may include a recess portion 25 between the second metal part 210 and the third metal part 220.

The fourth maximum width D4 may be smaller than the second maximum width D2 and the third maximum width D3. As a result, the stepped portion 23 may be disposed inside the fourth metal part 230. That is, the stepped portion 23 may be disposed between the inner surface of the third metal part 220 and the inner surface of the fourth metal part 230. In addition, the inner surface of the third metal part 220 may be connected to the inner surface of the fourth metal part 230 through the bottom surface of the stepped portion 23.

The border surface between the third metal part 220 and the fourth metal part 230 may be defined as a plane extended to be parallel with the top surface of the substrate 20 from the bottom surface of the stepped portion 23.

When viewed from the outer surface of the metal sidewall 20, at the borders of the first metal part 200 and the second metal part 210, the second metal part 210 and the third metal part 220, and the third metal part 220 and the fourth metal part 230, border lines may be confirmed which appear while the widths in the directions from the inner surfaces of the metal parts 200, 210, 220, 230 to the outer surfaces are changed. That is, the outer surface of the metal sidewall 20 may include a first border line between the first metal part 200 and the second metal part 210, and a second border line between the second metal part 210 and the third metal part 220, and a third border line between the third metal part 220 and the fourth metal part 230, and the first to third border lines may be located corresponding to the recess portion 25 disposed on the outer surface of the metal sidewall 20. In addition, when a fifth metal part and a sixth metal part are included, a fourth border line and a fifth border line may be further included.

The thickness H1 of the first metal part 200 may be 40 μm to 60 μm, and may be 50 μm for example. The thickness H1 of the first metal part 200 may be made thinner than the thickness of the remaining metal parts. For example, the thickness H1 of the first metal part 200 may be controlled to be the same as the electrodes 100 and 110 and the pads 140 and 150, such that there may be an advantage that it may be integrally formed with the electrodes 100 and 110 and the pads 140 and 150.

The width between the two outer surfaces facing each other of the first metal part 200 may be 3.00 mm to 3.60 mm, and for example, may be 3.35 mm. The width between the two inner surfaces facing each other of the first metal part 200 may be 1.80 mm to 2.20 mm, and for example, may be 2.00 mm.

The thickness H2 of the second metal part 210 may be 190 μm to 210 μm, for example, 195 μm or 200 μm. The width between the two inner surfaces facing each other of the second metal part 210 may be 1.80 mm to 2.20 mm, and for example, may be 2.00 mm.

The thickness H3 of the third metal part 220 may be 190 μm to 250 μm, for example, 200 μm or 245 μm The width between the two inner surfaces facing each other of the third metal part 220 may be 1.80 mm to 2.20 mm, and for example, may be 2.00 mm.

The thickness H4 of the fourth metal part 230 may be 190 μm to 240 μm, and may be 200 μm or 230 μm for example. In this case, the thicknesses of the second to fourth metal parts 210, 220, and 230 may be the same or different. This may be due to manufacturing tolerances in the process, or may be intentionally controlled for the function of each metal part. The width between the two inner surfaces facing each other of the fourth metal part 230 may be 2.40 mm to 2.80 mm, and for example, may be 2.60 mm. The curvature of the corners connecting the two adjacent outer surfaces of the fourth metal part 230 may be 0.27 mm to 0.33 mm, and may be 0.30 mm for example. The height from the bottom surface of the first pad 140 or the second pad 150 to the top surface of the fourth metal part 230 may be 1.2 mm to 1.6 mm, and for example, may be 1.43 mm.

The thickness T of the light transmitting member 50 may be 150 μm to 400 μm. The ratio of the thickness T of the light transmitting member 50 and the height H4 from the bottom surface of the stepped portion 23 to the top surface of the metal sidewall 20 may be 0.75:1 to 2.00:1.

When the ratio of the height is 0.75:1 or more, the light transmitting member 50 may secure a minimum thickness capable of maintaining strength. In addition, when the ratio of the height is 2.00:1 or less, damage to the light transmitting member 50 due to a dicing blade may be prevented during package cutting.

Figure 6:
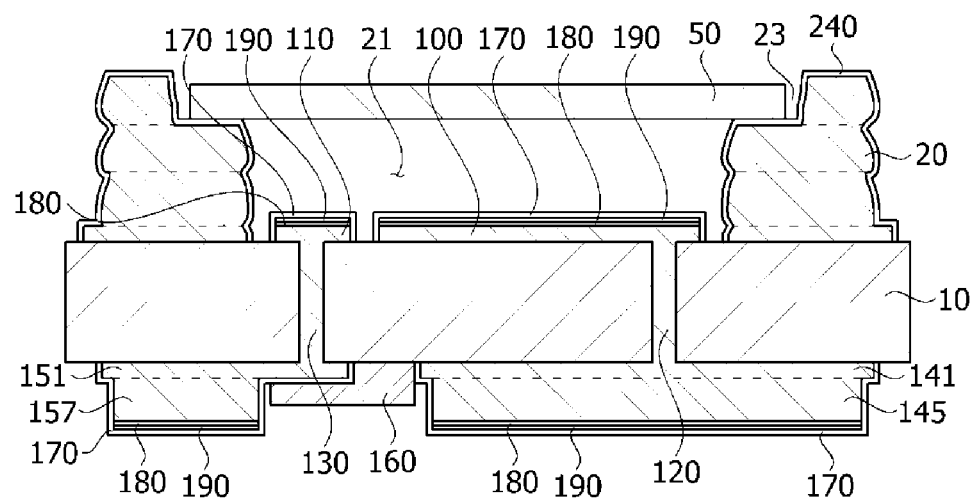
FIG. 6 is a modified example of FIG. 5.

FIG. 6 is a modified example of FIG. 5.

Referring to FIG. 6, a first protective layer 240 may be disposed on the surface of the metal sidewall 20. After the metal sidewall 20 is formed, the first protective layer 240 may be formed so as to surround the entire exposed surface of the metal sidewall 20.

The first protective layer 240 may suppress corrosion of the metal sidewall 20. The first protective layer 240 may refer to a reflective layer including a material that reflects ultraviolet light. The metal sidewall 20 may include copper (Cu), and the first protective layer 240 may include gold (Au).

A second protective layer 170 may be disposed on the surfaces of the first electrode 100, the second electrode 110, the first pad 140, and the second pad 150.

After the first electrode 100, the second electrode 110, the first pad 140, and the second pad 150 are formed, the second protective layer 170 may be formed so as to cover the entire exposed surfaces of the first electrode 100, the second electrode 110, the first pad 140, and the second pad 150.

The second protective layer 170 may suppress corrosion of the first electrode 100, the second electrode 110, the first pad 140, and the second pad 150. The second protective layer 170 may refer to a reflective layer including a material that reflects ultraviolet light. The first electrode 100, the second electrode 110, the first pad 140, and the second pad 150 may include copper (Cu), and the second protective layer 170 may include gold (Au).

The third conductive layer 180 may be disposed between the first electrode 100, the second electrode 110, the first pad 140, and the second pad 150 and the second protective layer 170. The third conductive layer 180 may be disposed on the first electrode 100 and the second electrode 110 and under the second-first conductive layer 145 and the second-second conductive layer 157. The third conductive layer 180 may improve adhesion between the first electrode 100, the second electrode 110, the first pad 140, and the second pad 150 and the second protective layer 170. The third conductive layer 180 may include nickel (Ni).

The fourth conductive layer 190 may be disposed between the third conductive layer 180 and the second protective layer 170. The fourth conductive layer 190 may suppress migration of nickel (Ni). The fourth conductive layer 190 may include palladium (Pd).

Figure 7:
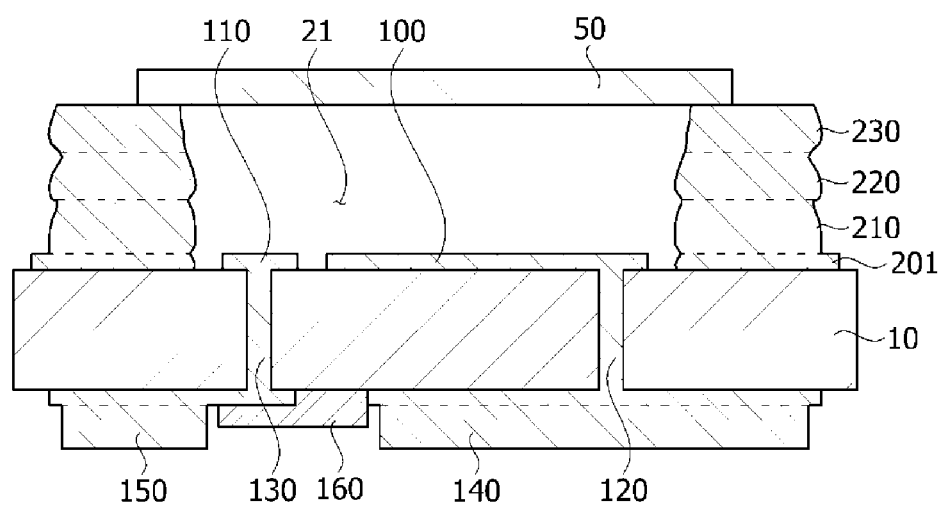
FIG. 7 is another modified example of FIG. 5.

FIG. 7 is another modified example of FIG. 5.

Referring to FIG. 7, a stepped portion may not be formed in the metal sidewall 20.

In this case, the bottom surface of the light transmitting member 50 may be disposed higher than the top surface of the metal sidewall 20.

Hereinafter, a process of manufacturing a semiconductor device package according to the present invention will be described.

FIGS. 8 to 12 are views showing a manufacturing process of a semiconductor device package according to the present invention.

Figure 8:
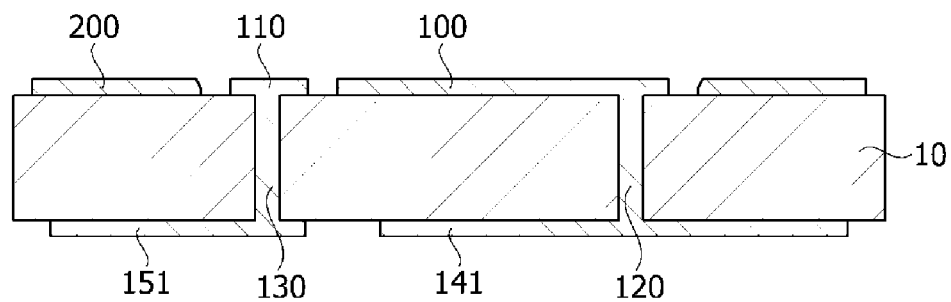
FIGS. 8 to 12 are views showing a manufacturing process of a semiconductor device package according to the present invention.

Referring to FIG. 8, after a via hole is processed in the substrate 10, the first electrode 100, the second electrode 110, the first metal part 200, the first through electrode 120, the second through electrode 130, the first-first conductive layer 141, and the first-second conductive layer 151 may be simultaneously formed by electroplating.

In this case, the first electrode 100, the second electrode 110, the first metal part 200, the first through electrode 120, the second through electrode 130, the first-first conductive layer 141, and the first-second conductive layer 151 may have the same composition.

In addition, the first electrode 100, the second electrode 110, the first metal part 200, the first-first conductive layer 141, and the first-second conductive layer 151 may be formed to have the same height.

The electroplating may be performed after sputtering and pattern formation using a dry film.

After the electroplating, the dry film or the like may be removed by etching. As a result, in the substrate 10, the remaining region may be exposed to the outside, except for regions in which the first electrode 100, the second electrode 110, the first metal part 200, the first-first conductive layer 141, and the first-second conductive layer 151 are formed.

Figure 9:
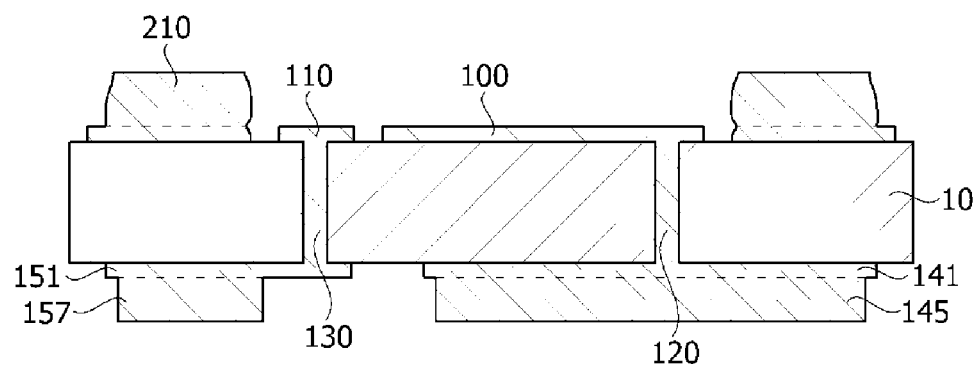

Referring to FIG. 9, the second-first conductive layer 145, the second-second conductive layer 157, and the second metal part 210 may be simultaneously formed by plating.

In this case, the second-first conductive layer 145, the second-second conductive layer 157, and the second metal part 210 may have the same composition.

In addition, the second-first conductive layer 145, the second-second conductive layer 157, and the second metal part 210 may be formed to have the same height.

Figure 10:
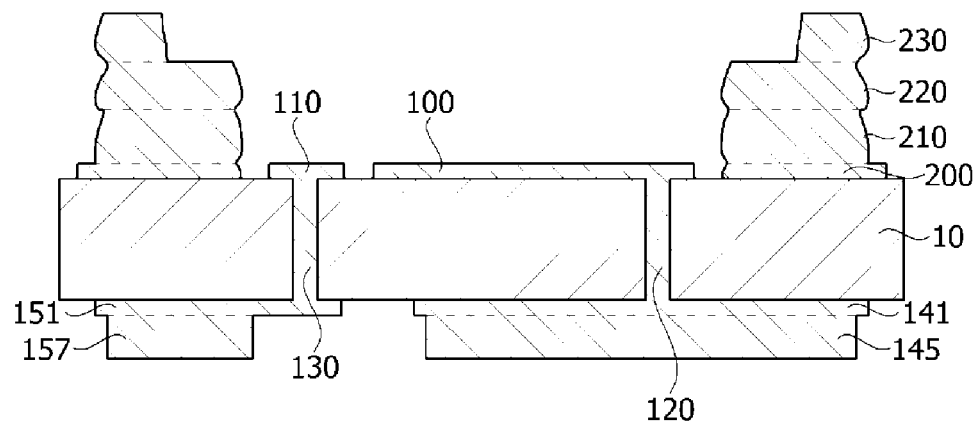

Referring to FIG. 10, the third metal part 220 and the fourth metal part 230 may be sequentially formed by plating.

The second metal part 210, the third metal part 220, and the fourth metal part 230 may be formed by individual plating processes. For example, a time gap may exist between the first plating process of forming the second metal part 210 and the second plating process of forming the third metal part 220.

Since the maximum height of the metal part that may be formed by a single plating process may be limited, the metal sidewall 20 may not be integrally formed and may include a plurality of metal parts.

Figure 11:
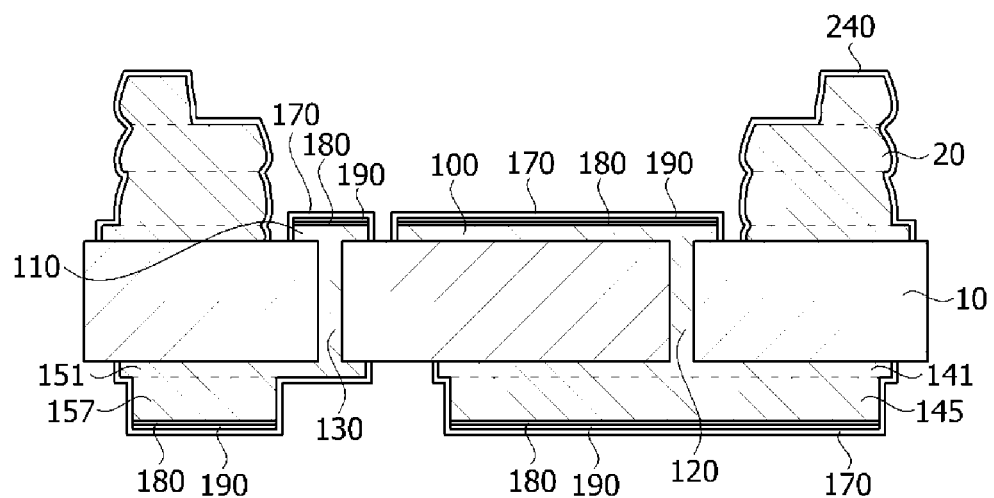

Referring to FIG. 11, after the third conductive layer 180 and the fourth conductive layer 190 are sequentially formed by plating, the first protective layer 240 and the second protective layer 170 are formed simultaneously by plating.

Figure 12:
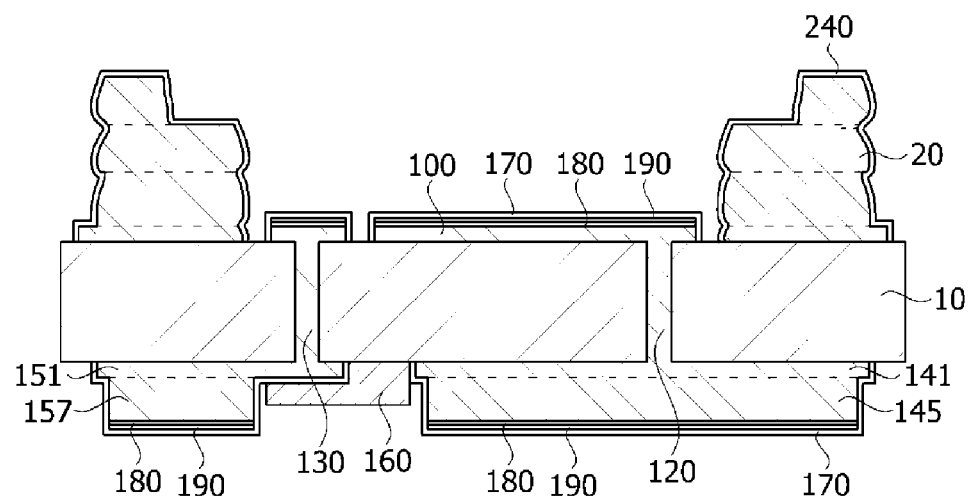

Referring to FIG. 12, an insulating portion 160 may be disposed.

Figure 13:
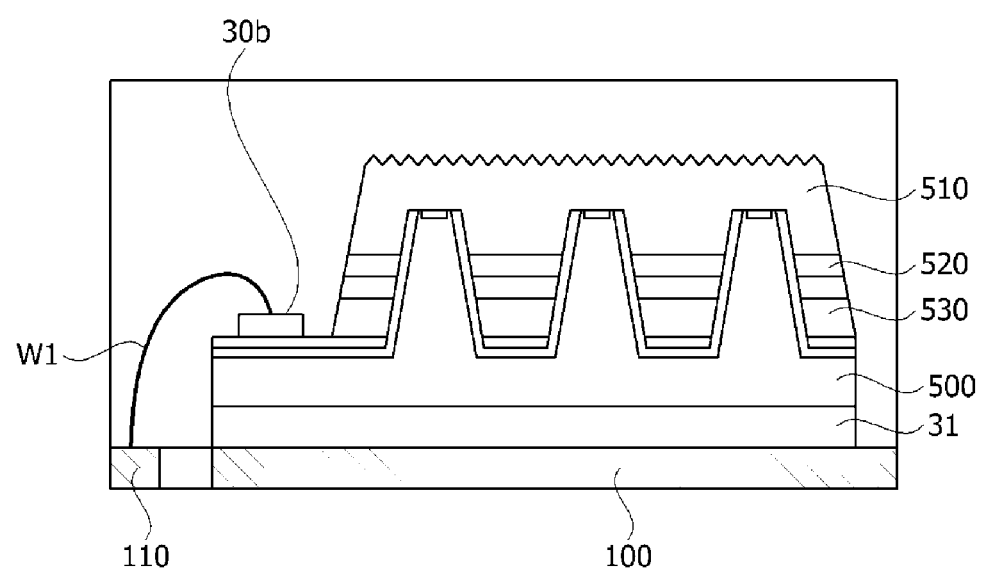
FIG. 13 is a conceptual diagram of the semiconductor device of FIG. 1.

After the semiconductor device 30 and the Zener diode 40 are disposed as shown in FIG. 1, when the light transmitting member 50 is disposed as shown in FIG. 6, the manufacturing process of the semiconductor device package may be completed. FIG. 13 is a conceptual diagram of the semiconductor device of FIG. 1.

Referring to FIG. 13, the semiconductor device 30 may include a semiconductor structure 500 including a first conductivity type semiconductor layer 510, a second conductivity type semiconductor layer 530, and an active layer 520 disposed between the first conductivity type semiconductor layer 510 and the second conductivity type 530, a third electrode connected to the first conductivity type semiconductor layer 510, and a fourth electrode (not shown) electrically connected to the second conductivity type semiconductor layer 530.

The semiconductor structure 500 may include all of the features of the semiconductor structure described above. The semiconductor structure 500 may include a first recess formed up to a partial region of the first conductivity type semiconductor layer 510 by passing through the second conductivity type semiconductor layer 530 and the active layer 520.

The third electrode may be disposed inside the first recess to be electrically connected to the first conductivity type semiconductor layer 510. Further, the fourth electrode (not shown) may be disposed under the second conductivity type semiconductor layer 530.

The first metal layer 501 may be extended into the first recess to be electrically connected to the third electrode. In addition, the second metal layer 502 may be electrically connected to a fourth electrode (not shown). The insulating layer may electrically insulate the first metal layer 501 and the second metal layer 502.

The conductive substrate 31 may be disposed under the first metal layer 501 to be electrically connected to the first electrode 100. An electrode pad 30b may be electrically connected to the second metal layer 502 and may be electrically connected to the second electrode 110 by a first wire W1.

In the above, the semiconductor device 30 has been described as being a light emitting device having a vertical chip structure, but is not limited thereto, and may be a light emitting device having a horizontal chip or flip chip structure.

Similarly, the Zener diode 40 may be a Zener diode having a vertical chip structure, but is not limited thereto, and may be a Zener diode having a horizontal chip or flip chip structure.

The semiconductor device may be applied to various types of light source devices. For example, the light source device may be a concept including a sterilization device, a curing device, a lighting device, a display device, and a vehicle lamp. That is, the semiconductor device may be applied to various electronic devices that are disposed in a case to provide light.

The sterilization device may sterilize a desired area by including the semiconductor device according to the embodiment. The sterilization device may be applied to household appliances such as water purifiers, air conditioners, and refrigerators, but is not limited thereto. That is, the sterilization device may be applied to all of a variety of products (e.g., medical devices) requiring sterilization.

As an example, the water purifier may be equipped with a sterilization device according to the embodiment to sterilize circulating water. The sterilization device may be disposed at a nozzle or outlet through which water circulates to irradiate ultraviolet rays. In this case, the sterilization device may include a waterproof structure.

The curing device may cure various types of liquids by including the semiconductor device according to the embodiment. The liquid may be the broadest concept including all of the various materials that are cured when irradiated with ultraviolet rays. As an example, the curing device may cure various types of resins. Alternatively, the curing device may be applied to cure cosmetic products such as manicure.

The lighting device may include a light source module including a substrate and the semiconductor device of the embodiment, a heat dissipation unit for dissipating heat from the light source module, and a power supply unit for processing or converting an electrical signal provided from the outside to provide the light source module. In addition, the lighting device may include a lamp, a head lamp, a street lamp, and the like.

The display device may include a bottom cover, a reflector, a light emitting module, a light guide plate, an optical sheet, a display panel, an image signal output circuit, and a color filter. The bottom cover, the reflector, the light emitting module, the light guide plate, and the optical sheet may constitute a backlight unit.

The reflector may be disposed on the bottom cover, and the light emitting module may emit light. The light guide plate may be disposed in front of the reflector to guide the light emitted from the light emitting module to the front, and the optical sheet may include a prism sheet and the like to be disposed in front of the light guide plate. The display panel may be disposed in front of the optical sheet, the image signal output circuit may supply the image signal to the display panel, and the color filter may be disposed in front of the display panel.

When the semiconductor device is used as a backlight unit of a display device, it may be used as an edge type backlight unit or a direct type backlight unit.

In addition to the above-described light emitting diode, the semiconductor device may be a laser diode.

Like the light emitting device, the laser diode may include a first conductivity type semiconductor layer, an active layer, and a second conductivity type semiconductor layer having the above-described structure. In addition, the p-type first conductivity type semiconductor and the n-type second conductivity type semiconductor are bonded to each other and use the electro-luminescence phenomenon in which light is emitted when current is passed, but there is a difference in the direction and phase of the emitted light. In other words, the laser diode may use a phenomenon called stimulated emission and a constructive interference phenomenon, so that light having one specific wavelength (monochromatic beam) may be emitted in the same direction with the same phase, and due to this characteristic, it may be used for optical communication, medical equipment, and semiconductor processing equipment.

The light-receiving device may be a photodetector, which is a kind of transducer that detects light and converts its intensity into an electric signal, as an example. As these photodetectors, photovoltaic cells (silicon, selenide), photoelectric devices (cadmium sulfide, cadmium selenide), photodiodes (for example, PDs with peak wavelengths in a visible blind spectral region or true blind spectral region), photo-transistors, photomultiplier tubes, photoelectric tubes (vacuum, gas encapsulated), IR (Infra-Red) detectors, etc. may be provided, but the embodiments are not limited thereto.

In addition, a semiconductor device such as a photo detector may be generally manufactured using a direct bandgap semiconductor having excellent light conversion efficiency. Alternatively, photo detectors have various structures, and the most common structure may be a pin-type photo detector using a p-n junction, a Schottky photo detector using a Schottky junction, and a metal semiconductor metal (MSM) type photo detector.

The photodiode may include a first conductivity-type semiconductor layer, an active layer, and a second conductivity-type semiconductor layer having the above-described structure, as in the light emitting device, and may be formed of a p-n junction or a pin structure. The photodiode may be operated by applying a reverse bias or zero bias, and when light is incident on the photodiode, electrons and holes may be generated, and a current may flow. In this case, the magnitude of the current may be substantially proportional to the intensity of light incident on the photodiode.

A photovoltaic cell or a solar cell may convert light into electric current, as a type of photodiode. The solar cell may include a first conductivity-type semiconductor layer, an active layer, and a second conductivity-type semiconductor layer having the above-described structure, similarly to the light emitting device.

In addition, it may be used as a rectifier of an electronic circuit through the rectification characteristic of a general diode using a p-n junction, and may be applied to an oscillating circuit by being applied to an ultra-high frequency circuit.

In addition, the above-described semiconductor device is not necessarily implemented only as a semiconductor, and may further include a metallic material in some cases. For example, a semiconductor device such as a light receiving device may be implemented using at least one of Ag, Al, Au, In, Ga, N, Zn, Se, P, or As, and may be implemented using a semiconductor material or an intrinsic semiconductor material doped by a p-type or n-type dopant.

The embodiments have been described above, these are only examples and do not limit the present invention. Accordingly, it will be appreciated that various modifications and applications not illustrated above are possible without departing from the essential characteristics of the present embodiment by those of ordinary skill in the field to which the present invention pertains. For example, each of the components specifically shown in the embodiments may be modified and implemented. In addition, the differences related to these modifications and applications should be construed as being included in the scope of the present invention defined in the appended claims.

The invention claimed is:

1. A semiconductor device package comprising:
    a substrate including an electrode disposed on one surface thereof;
    a metal sidewall disposed on the substrate to surround the electrode;
    a semiconductor device disposed on the electrode; and
    a light transmitting member disposed on the metal sidewall to cover the semiconductor device, wherein the metal sidewall has an inner surface and an outer surface, at least one of the inner surface and the outer surface having a convex surface, and the metal sidewall includes:
    a first metal part disposed on the substrate;
    a second metal part disposed on the first metal part; and
    a third metal part disposed on the second metal part,
    wherein each of the inner surface and the outer surface of the metal sidewall includes one of a plurality of recess portions between the second metal part and the third metal part, and another of the plurality of recess portions between the first metal part and the second metal part respectively, the recess portions formed on the inner surface and the recess portions formed on the outer surface being respectively corresponding to each other, and the corresponding recess portions on the inner and outer surfaces being vertically aligned and positioned at identical heights relative to the substrate,
    wherein the first metal part, the second metal part and the third metal part are stacked in a first direction perpendicular to the one surface of the substrate, such that the first metal part, the second metal part and the third metal part overlap with each other in the first direction, and do not overlap with each other in a second direction perpendicular to the first direction,
    wherein the first metal part has the greatest width in the second direction among the first metal part, the second metal part and the third metal part, and the third metal part has the smallest width in the second direction among the first metal part, the second metal part and the third metal part, and
    wherein the first metal part, the second metal part, and the third metal part are spaced apart from the electrode in the second direction.

2. The semiconductor device package according to claim 1, wherein the first metal part includes a first border portion protruding further outward than a convex portion of an outer surface of the second metal part, and
    the thickness of the first metal part is smaller than that of the second metal part.

3. The semiconductor device package according to claim 1, wherein the metal sidewall includes a fourth metal part disposed on the third metal part,
    the second metal part includes a second maximum width from the inner surface to the outer surface of the metal sidewall,
    the third metal part includes a third maximum width from the inner surface to the outer surface of the metal sidewall,
    the fourth metal part includes a fourth maximum width from the inner surface to the outer surface of the metal sidewall, the fourth maximum width is smaller than the second maximum width and the third maximum width, the metal sidewall includes a stepped portion on which the light transmitting member is disposed, and the ratio of the thickness of the light transmitting member and the height from the bottom surface of the stepped portion to the top surface of the metal sidewall is 0.75:1 to 2.00:1.

4. The semiconductor device package according to claim 1, wherein the electrode includes:
a first electrode disposed on the substrate and on which the semiconductor device is disposed; and
a second electrode disposed on the substrate and connected to the semiconductor device through a first wire, and
wherein the semiconductor device package further comprises:
a first pad and a second pad disposed under the substrate;
a first through electrode passing through the substrate and connecting the first electrode and the first pad; and
a second through electrode passing through the substrate and connecting the second electrode and the second pad.

5. The semiconductor device package according to claim 4,
wherein the first pad includes:
a first-first conductive layer disposed under the substrate; and
a second-first conductive layer disposed under the first-first conductive layer, and
the second pad includes:
a first-second conductive layer disposed under the substrate; and
a second-second conductive layer disposed under the first-second conductive layer, and
wherein the first-second conductive layer includes a first protrusion protruding closer toward the first pad than the second-second conductive layer and connected to the second through electrode.

6. The semiconductor device package according to claim 5, further comprising:
an insulating portion disposed between the first pad and the second pad, wherein the insulating portion surrounds the first protrusion,
wherein the first pad includes a recess recessed in a direction opposite to the second pad at a position facing the first protrusion, and
the insulating portion includes a second protrusion disposed in the recess.

7. The semiconductor device package according to claim 5, wherein the first-first conductive layer includes a second border portion that protrudes further outward than the second-first conductive layer, and
the first-second conductive layer includes a third border portion that protrudes further outward than the second-second conductive layer.

8. The semiconductor device package according to claim 4, further comprising:
a Zener diode disposed on the second electrode and connected to the first electrode through a second wire,
wherein the first electrode includes:
a first mounting portion on which the semiconductor device is disposed; and
a first connection portion connecting the first mounting portion and the first through electrode, and connecting the Zener diode through a second wire,
wherein the second electrode includes:
a second mounting unit on which the Zener diode is disposed; and
a second connection portion connecting the second mounting portion and the second through electrode and connecting the semiconductor device through a first wire, and
wherein the first connection portion and the second connection portion are disposed to be spaced apart from each other in the second direction, and the first mounting portion and the second mounting portion are disposed to be spaced apart from each other in a third direction perpendicular to the second direction between the first connecting portion and the second connecting portion.

9. The semiconductor device package according to claim 4,
further comprising:
a first protective layer surrounding the metal sidewall and including gold (Au);
a second protective layer surrounding the first electrode, the second electrode, the first pad, and the second pad, respectively, and including gold (Au);
a third conductive layer disposed between the first electrode, the second electrode, the first pad, and the second pad and the second protective layer and including nickel (Ni); and
a fourth conductive layer disposed between the third conductive layer and the second protective layer and including palladium (Pd),
wherein the metal sidewall contains copper (Cu), and
the first electrode, the second electrode, the first pad, and the second pad have the same composition as the metal sidewall.

10. The semiconductor device package according to claim 1, wherein each of the first metal part, the second metal part and the third metal part has a convex surface.

11. A semiconductor device package, comprising:
a substrate including an electrode disposed on one surface thereof;
a metal sidewall disposed on the substrate to surround the electrode; a semiconductor device disposed on the electrode; and
a light transmitting member disposed on the metal sidewall to cover the semiconductor device,
wherein the metal sidewall has an inner surface and an outer surface, the inner surface and the outer surface respectively extend in a first direction perpendicular to the one surface of the substrate such that the inner surface and the out surface do not overlap with each other in the first direction,
wherein the inner surface includes a plurality of first protruding portions and a plurality of first recess portions respectively formed between two first protruding portions, and the other surface includes a plurality of second protruding portions and a plurality of second recess portions respectively formed between two second protruding portions, the plurality of first recess portions and the plurality of second recess portions being respectively corresponding to each other, and corresponding recess portions on the inner and outer surfaces being vertically aligned and positioned at identical heights relative to the substrate, and
wherein an outermost portion of the outer surface is offset from an outermost side surface of the substrate in a second direction perpendicular to the first direction toward the semiconductor device.

12. The semiconductor device package according to claim 11, wherein the metal sidewall includes a first metal part, a second metal part, and a third metal part sequentially disposed on the substrate, and the first metal part includes a first border portion protruding further outward than a convex portion of an outer surface of the second metal part, and has a thickness smaller than that of the second metal part.

13. The semiconductor device package according to claim 12, wherein the metal sidewall further includes a fourth metal part disposed on the third metal part such that a part of a top surface of the third metal part is not covered by the fourth metal part, and the light transmitting member is supported by a portion of the third metal part and a stepped portion formed by the fourth metal part.

14. The semiconductor device package according to claim 11, wherein the electrode includes:

a first electrode on which the semiconductor device is disposed; and a second electrode disposed on the substrate to be spaced apart from the first electrode and connected to the semiconductor device through a first wire, and wherein the semiconductor device package further includes:

a first pad and a second pad disposed to be separated from each other under the substrate;

a first through electrode passing through the substrate and connecting the first electrode and the first pad; and a second through electrode passing through the substrate and connecting the second electrode and the second pad.

15. The semiconductor device package according to claim 14, wherein the first pad includes:

a first-first conductive layer disposed under the substrate; and a second-first conductive layer disposed under the first-first conductive layer, and wherein the second pad includes:

a first-second conductive layer disposed under the substrate and having a first protrusion extending toward the first pad through a lower end of the second through electrode; and a second-second conductive layer disposed under the first-second conductive layer so that the first protrusion is exposed.

16. The semiconductor device package according to claim 15, further comprising an insulating portion disposed between the first pad and the second pad and including a recess receiving the first protrusion and a second protrusion covering the first protrusion.

17. The semiconductor device package according to claim 15, wherein the first-first conductive layer includes a second border portion protruding further outward than the second-first conductive layer, and the first-second conductive layer includes a third border portion protruding further outward than the second-second conductive layer.

18. The semiconductor device package according to claim 14, further comprising:

a Zener diode disposed on the second electrode and connected to the first electrode through a second wire, wherein the first electrode includes:

a first mounting portion on which the semiconductor device is disposed; and a first connection portion connecting the first mounting portion and the first through electrode and being connected to the Zener diode through a second wire, wherein the second electrode includes:

a second mounting portion on which the Zener diode is disposed; and a second connection portion connecting the second mounting portion and the second through electrode and being connected to the semiconductor device through a first wire, wherein the first connection portion and the second connection portion are disposed to be spaced apart from each other in the second direction, and wherein the first mounting portion and the second mounting portion are disposed to be spaced apart from each other in a third direction perpendicular to the second direction between the first connection portion and the second connection portion.

19. The semiconductor device package according to claim 14, further comprising:

a first protective layer surrounding the metal sidewall;

a second protective layer surrounding the first electrode, the second electrode, the first pad, and the second pad, respectively;

a third conductive layer disposed between the first electrode, the second electrode, the first pad, and the second pad and the second protective layer, and a fourth conductive layer disposed between the third conductive layer and the second protective layer.

20. The semiconductor device package according to claim 11, wherein the at least one recess portion is formed at a junction of two convex surfaces.

* * * * *